United States Patent
Kitamura et al.

[11] Patent Number: 5,844,275
[45] Date of Patent: Dec. 1, 1998

[54] HIGH WITHSTAND-VOLTAGE LATERAL MOSFET WITH A TRENCH AND METHOD OF PRODUCING THE SAME

[75] Inventors: Akio Kitamura; Naoto Fujishima, both of Kawasaki, Japan

[73] Assignee: Fuji Electric Co., Ltd., Kawasaki, Japan

[21] Appl. No.: 531,312

[22] Filed: Sep. 20, 1995

[30] Foreign Application Priority Data

Sep. 21, 1994 [JP] Japan ................................. 6-226882

[51] Int. Cl.$^6$ ........................... H01L 29/76; H01L 29/94; H01L 31/062
[52] U.S. Cl. ........................... 257/335; 257/336; 257/343
[58] Field of Search ................................. 257/329, 330, 257/331, 332, 335, 336, 341, 343

[56] References Cited

U.S. PATENT DOCUMENTS

| | | | |
|---|---|---|---|
| 5,319,235 | 6/1994 | Kihara et al. | 257/510 |
| 5,539,238 | 7/1996 | Malhi | 257/335 |

FOREIGN PATENT DOCUMENTS 6-97450  4/1994  Japan .

OTHER PUBLICATIONS

Sze. "Semiconductor Devices Physics & Technology", 1985; pp. 110–111.
Sakai et al., The institute of Electrical Engineers of Japan, Research Paper EDD–92–83–92, pp. 85–92 (1992).

*Primary Examiner*—Wael Fahmy
*Attorney, Agent, or Firm*—Finnegan, Henderson, Farabow, Garrett & Dunner, L.L.P.

[57] ABSTRACT

A high withstand-voltage lateral MOSFET with a trench includes a first conductive type semiconductor layer; a second conductive type source region; a second conductive type drain drift region, the second conductive type source region and the second conductive type drain drift region being formed in a portion of a surface layer of the first conductive type semiconductor layer at a distance from each other; a trench which formed in a surface layer of the second conductive type drain drift region from the surface side thereof; a second conductive type drain region formed in the surface layer of the first conductive type semiconductor layer on the side opposite to the second conductive type source region with respect to the trench and partially overlaps with the second conductive type drain drift region; a gate electrode provided on the surface of a surface exposed portion of the first conductive type semiconductor layer through a gate oxide film; a source electrode provided on the surface of the second conductive type source region; and a drain electrode provided on the surface of the second conductive type drain region.

15 Claims, 10 Drawing Sheets

HIGH WITHSTAND-VOLTAGE LATERAL MOSFET WITH A TRENCH AND METHOD OF PRODUCING THE SAME

BACKGROUND OF THE INVENTION

1. Field of the Invention

The present invention relates to a high withstand-voltage and a low on-resistance lateral MOSFET (Metal-Oxide-Semiconductor Field Effect Transistor) provided with a trench, which is used as a separate unit device or used in an IC (integrated circuit) such as a power supply IC, a motor driving IC, a crystalline liquid driving IC, etc.

2. Description of the Related Art

The inventor has confirmed two reports about a lateral MOSFET having a trench structure. The first example of the lateral MOSFET having a trench structure is a top-drain-trench type RESURF DMOS transistor structure disclosed in Japanese Patent Unexamined Publication No. Hei 6-97450. In this device, source and base diffusion layers are formed on one side surface of a trench, the surface of the diffusion layers are covered with a thin gate oxide film, and a gate electrode is buried in this trench. In addition, a drain drift layer is formed on the other side surface of the trench, and the surface of the drain drift layer is covered with a thick oxide film. The second example of the lateral MOSFET provided with a trench structure is a TDD (Trench Drain Double-diffusion) MOSFET structure (Sakai et al.: The Institute of Electrical Engineers of Japan, Research Paper EDD-92-92). FIG. 13 is a sectional view showing the MOSFET. A p-type base region 8 and an n-type source region 9 are formed by double diffusion in self-alignment on a surface layer of an epitaxial substrate 16 having an n-type semiconductor layer 16 on an $n^+$-type substrate. A trench 3 is formed in a drain region, and an n-type drain region 11 is diffused from the inner wall of the trench 3. Thereafter, a drain electrode 15 is formed on the inner surface of the trench 3. When a positive voltage is applied to a gate electrode 7 provided, through a gate oxide film 6, on the surface of the p-type base region 8 between the n-type source region 9 and the n-type semiconductor layer, a source electrode 14 provided on the n-type source region 9 and the drain electrode 15 are rendered electrically conductive with each other.

In the device structure of the above-mentioned first example, indeed the device cell pitch which is a size per device can be reduced, but two kinds of oxide films must be formed in the left and right in one trench, so that the production process becomes very complicated. In the structure of the second example, on the other hand, a trench is made to reduce a drain contact resistance, but the on-resistance can be reduced by only 5% in the maximum as described in the paper.

SUMMARY OF THE INVENTION

The present invention has been made in view of the above, and therefore an object of the invention is to provide a high withstand-voltage lateral MOSFET in which a trenching step is added to an ordinary Bi-CDMOS process without such a complicated process as mentioned above, so that the trade-off characteristic of the withstand voltage and the on-resistance of the device can be improved.

To solve the foregoing problems, according to an aspect of the present invention, there is provided a high withstand-voltage lateral MOSFET with a trench, comprising: a second conductive type source region and a second conductive type drain drift region which are formed in a portion of a surface layer of a first conductive type semiconductor layer at a distance from each other; a trench which is formed in a surface layer of the second conductive type drain drift region from the surface side thereof; a second conductive type drain region which is formed in the surface layer of the first conductive type semiconductor layer on the side opposite to the second conductive type source region with respect to the trench and partially overlaps with the second conductive type drain drift region; a gate electrode which is provided on the surface of a surface exposed portion of the first conductive type semiconductor layer through a gate oxide film; and a source electrode and a drain electrode which are provided on the surface of the second conductive type source region and on the surface of the second conductive type drain region respectively.

According to another aspect of the present invention, there is provided a high withstand-voltage lateral MOSFET with a trench, comprising: a first conductive type base region which is formed in a portion of a surface layer of a first conductive type semiconductor layer; a second conductive type source region which is formed in self-alignment in a portion of a surface layer of the first conductive type base region; a second conductive type drain drift region which is formed in a portion of the surface layer of the first conductive type semiconductor layer; a trench which is formed in a surface layer of the second conductive type drain drift region from the surface side thereof; a second-conductive type drain region which is formed in the surface layer of the first conductive type semiconductor layer on the side opposite to the first conductive type base region with respect to the trench and partially overlaps with the second conductive type drain drift region; a gate electrode which is provided on the surface of a surface exposed portion of the first conductive type base region through a gate oxide film; and a source electrode and a drain electrode which are provided on the surface of the second conductive type source region and on the surface of the second conductive type drain region respectively.

According to a further aspect of the present invention, there is provided a high withstand-voltage lateral MOSFET with a trench, comprising: a first conductive type base region which is formed in a portion of a surface layer of a second conductive type semiconductor layer; a second conductive type source region which is formed in self-alignment in a portion of a surface layer of the first conductive type base region; a second conductive type drain drift region which is formed in a portion of the surface layer of the second conductive type semiconductor layer; a trench which is formed in a surface layer of the second conductive type drain drift region from the surface side thereof; a second conductive type drain region which is formed in the surface layer of the second conductive type semiconductor layer on the side opposite to the first conductive type base region with respect to the trench and partially overlaps with the second conductive type drain drift region; a gate electrode which is provided on the surface of a surface exposed portion of the first conductive type base region through a gate oxide film; and a source electrode and a drain electrode which are provided on the surface of the second conductive type source region and on the surface of the second conductive type drain region, respectively.

Preferably, a first conductive type channel region is formed in a surface layer directly under the gate electrode between the second conductive type source region and the trench.

Preferably, an insulating film or a semi-insulating film is filled up in the trench.

Preferably, the gate electrode is elongated over the trench.

Preferably, the depth of the trench may be larger than the width thereof, and a plurality of trenches and a plurality of second conductive type drain drift regions may be formed in series.

As for a method of producing such a high withstand-voltage lateral MOSFET, after a trench is formed in a portion of a surface layer of a semiconductor layer, polysilicon including impurities is laid up in the trench, and a second conductive type drain drift region is formed by the diffusion of the impurities from the polysilicon.

After a trench is formed in a portion of a surface layer of a semiconductor layer, a second conductive type drain drift region is formed by injection of impurity ions from an oblique direction into the inner surface of the trench and heat treatment performed thereafter.

Alternatively, reversely, after a second conductive type drain drift region is formed by the introduction of impurities into a portion of a surface layer of a semiconductor layer and heat treatment performed thereafter, a trench is formed in a portion of a surface layer of the second conductive type drain drift region.

With the above-mentioned means, a trench is formed in a surface layer of a second conductive type drain drift region from the side surface thereof, so that the drift length can be increased without increasing the drain drift region to thereby make the withstand voltage high. In addition, in this lateral MOSFET with a trench, there is no reduction of a current path caused by JFET as in a conventional lateral MOSFET, so that the on-resistance can be reduced. As a result, the trade-off characteristic of the withstand voltage and the on-resistance can be improved greatly.

In other words, it is possible to reduce the drain drift region without reducing the drift length substantially, and it is possible to reduce the device cell pitch on a large scale.

The same operation can be expected in a lateral MOSFET in which a second conductive type source region is formed in self-alignment with a first conductive type base region, or in a lateral MOSFET in which a first conductive type base region is formed in a surface layer of a second conductive type well region.

When a first conductive type channel region is formed in a surface layer of a semiconductor layer directly under a gate electrode between the second conductive type source region and the trench, the threshold can be controlled effectively, and the depletion of a second conductive type drain drift region can be accelerated.

When an insulating film or a semi-insulating film is filled up in the trench, the distribution of electric potential can be equalized effectively so as to make the withstand voltage high.

Particularly when the gate electrode is elongated over the trench, the withstand voltage can be made higher by the field plate effect.

When the depth of the trench is larger than the width thereof, or when a plurality of trenches and a plurality of second conductive type drain drift regions are formed in series, the drain drift length is increased, so that the withstand voltage can be made higher effectively.

As for a method of producing such a high withstand-voltage lateral MOSFET, there are a method in which after a trench is formed in a portion of a surface layer of a semiconductor layer, polycrystalline silicon including impurities is laid up in the trench, and a second conductive type drain drift region is formed by the diffusion of the impurities from the polycrystalline silicon, a method in which after a trench is formed in a portion of a surface layer of a semiconductor layer, a second conductive type drain drift region is formed by the injection of impurity ions obliquely into the inner surface of the trench and the heat treatment performed thereafter, and a method in which, reversely, after a second conductive type drain drift region is formed by the introduction of impurities to a portion of a surface layer of a semiconductor layer and heat treatment performed thereafter, a trench is formed in a portion of a surface layer of the second conductive type drain drift region. In the case of using any method, the increase of the number of the steps other than the steps of forming a trench is not large and a drain drift region can be formed surely.

The above and other objects and features of the present invention will be more apparent from the following description taken in conjunction with the accompanying drawings.

DETAILED DESCRIPTION OF THE PREFERRED EMBODIMENTS

Embodiments of the present invention will be described below in detail with reference to the drawings.

Figure 1:
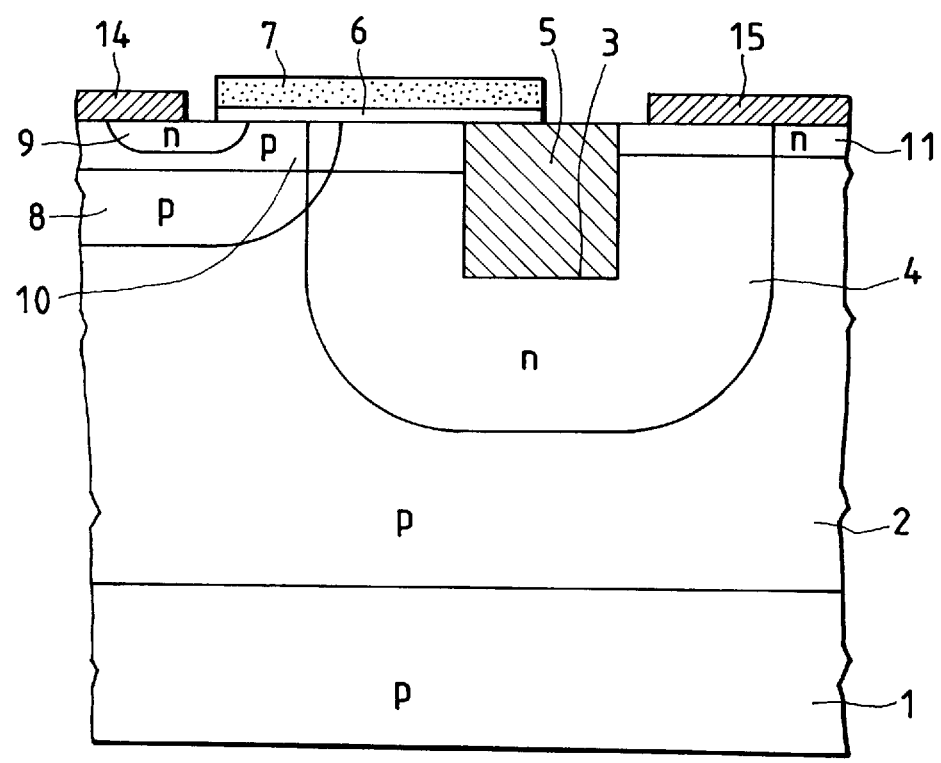
FIG. 1 is a sectional view of a main portion of a lateral MOSFET with a trench according to a first embodiment of the present invention.

FIG. 1 shows a sectional view illustrating a main portion of a lateral MOSFET with a trench, which is a first embodiment. A p-type well region 2 having common dimensions with a p-type well of a logic portion is formed in a surface layer of a p-type substrate 1 having a specific resistance of 12.5 Ωcm. The surface density of this p-type well region 2 is 1×10$^{15}$ cm$^{-3}$, and the diffusion depth (xj) is 3 μm. A p-type base region 8 and an n-type source region 9 are formed in a surface layer of the p-type well region 2 in self-alignment by double diffusion. A trench 3 which is 1 μm wide and 1 μm deep is formed in the surface layer of the p-type well region 2 at a slight distance from the p-type base region 8. An n-type drain drift region 4 is formed on the sides and bottom of the trench 3, and an insulating film 5 which is, for example, an oxide film is filled up in the trench 3. Diffusion is made uniformly in the side and bottom surfaces of the trench 3 with the surface density of 9×10$^{.}$ cm$^{-3}$ and diffusion depth xj of about 1.0 μm. A gate electrode 7 consisting of polysilicon is provided on the surface of the substrate 1 through a gate oxide film 6. The gate electrode 7 projects over the trench 3 from the n-type source region 9 by 0.5 μm. A p-type channel region 10 is formed on surface layers of the p-type base region 8 and the n-type drain drift region 4 directly under the gate electrode 7. Although the p-type channel region 10 is used to adjust the density of impurities of the semiconductor layer surface directly under the gate electrode 7, and to thereby control the threshold voltage of the MOSFET, the p-type channel region 10 is not always provided. An n-type drain region 11 is formed on a surface layer of the p-type well region 2 on the side opposite to the p-type base region 8 with respect to the trench 3, and a drain electrode 15 is provide so as to contact the n-type drain region 11. A source electrode 14 is provided so as to be in contact with the surface of the n-type source region 9.

The high withstand-voltage lateral MOSFET with a trench having this structure could attain a source-to-drain withstand voltage of 100 V. It is considered that the reason why the withstand voltage could be made high was in that the depletion of the n-type drain drift region 4 near the n-type source region 9 was accelerated by the field plate effect of the gate electrode 7 and the acceptor forming impurities in the p-type base region 8 and the p-type channel region 10, and the depletion of the rest portion of the n-type drain drift region 4 was also accelerated by acceptors in the p-type well region 2.

Figure 2:
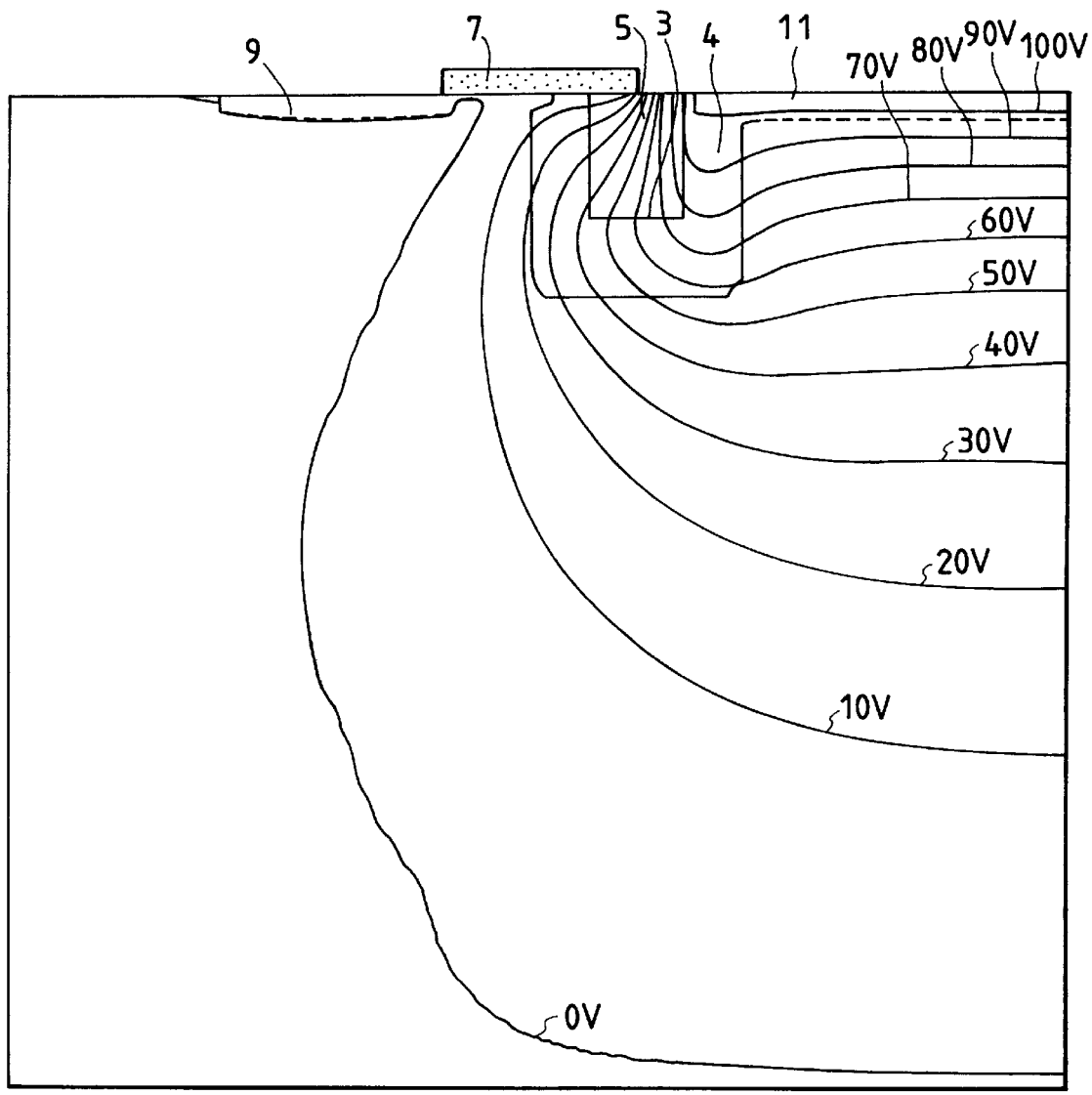
FIG. 2 is a potential distribution diagram in OFF-state of the lateral MOSFET with a trench in FIG. 1.

FIG. 2 shows the result of a simulation of potential distribution in this device structure at the time of OFF-state. A voltage of 100 V is applied between the source and the drain. It is apparent therefrom that equipotential lines drawn at every 10 V are distributed uniformly in the p-type well region 2, the n-type drain drift region 4 and the insulating film 5.

Next, as to the on-characteristic, the on-resistance (RonA) per unit region was 0.08 Ωmm$^2$ at the gate voltage 5 V and the drain voltage 0.1 V, so that the on-resistance could be reduced to about ½ of that in an ordinary lateral DMOSFET having the same withstand voltage.

Figure 3A:
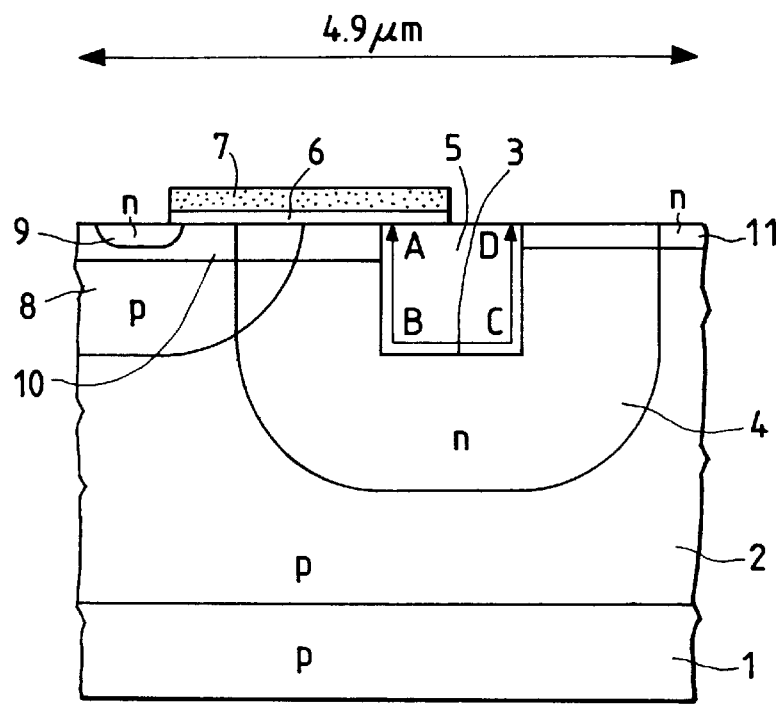
FIG. 3A is a sectional view of a main portion of a lateral MOSFET with a trench according to the present invention.
Figure 3B:
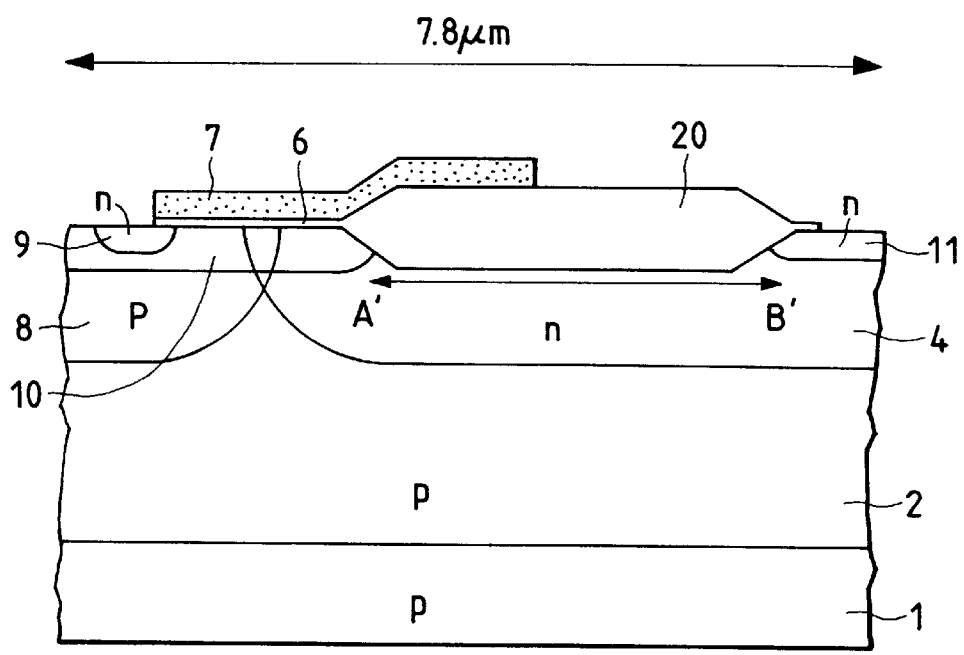
FIG. 3B is a sectional view of a main portion of a conventional lateral DMOSFET.

FIGS. 3A and 3B are sectional views showing the respective structures of the present invention and an ordinary lateral DMOSFET in comparison with each other. In the drawings, reference numeral 1 represents a p-type substrate; 2, a p-type well region; 4, an n-type drain drift region; 6, a gate oxide film; 7, a gate electrode; 8, a p-type base region; 9, an n-type source region; 10, a p-type channel region; and 11, an n-type drain region. While drain drift length A'B' under a thick LOCOS oxide film 20 is 3 μm in the ordinary lateral DMOSFET shown in FIG. 3B, in the high withstand-voltage lateral MOSFET with a trench shown in FIG. 3A the n-type drain drift region 4 is formed on the side and bottom surfaces of the trench 3, and the drain drift length is kept in AB+BC+BD=3 μm along the inner surface of the trench 3, so that the device cell pitch can be reduced from 7.8 μm to 4.9 μm. In addition, while a current path is reduced at an end portion of the n-type drain drift region 4 on the source region side by a depletion layer in on-state in the ordinary lateral DMOSFET shown in FIG. 3B because of the JFET structure thereof, in the high withstand-voltage lateral MOSFET with a trench shown in FIG. 3A, diffusion arises from the side surfaces of the trench 3 laterally so that a current path of the source region side end portion is ensured sufficiently to thereby make the on-resistance low.

A method of producing the high withstand-voltage lateral MOSFET with a trench shown in FIG. 1 will be described. The p-type well region 2 having common dimensions with the p-type well of the logic portion is formed on the surface layer of the p-type substrate 1 having a specific resistance of 12.5 Ωcm. The surface density of this p-type well region 2 is 1×10$^{16}$ cm$^{-3}$, and the diffusion depth (xj) is 3 μm. The trench 3 which is 1 μm wide and 1 μm deep is formed in the surface layer of the p-type well region 2 by photo-etching technology, and n-type doped polysilicon is laid thereon. Thereafter, n-type impurities in the doped polysilicon are diffused from the inner surface of the trench 3 by heat treatment, so that the n-type drain drift region 4 having a surface density of 9×10$^{16}$ cm$^{-3}$ and diffusion depth xj of about 1.0 μm is formed uniformly on the side and bottom surfaces of the trench 3. Subsequently, the polysilicon is etched and removed, and the oxide film 5 is laid in the trench 3. The p-type channel region 10 is formed over the portion where the p-type base region 8 should be formed later so that the p-type channel region 10 reaches the trench 3. Then, the gate oxide film 6 which is 20 nm thick is formed, and polysilicon is laid thereon so as to form the gate electrode 7 by photo-etching technology. The drain-side end of this gate electrode 7 is formed to project over the trench 3 by 0.5 μm. The p-type base region 8 and the n-type source region 9 are formed in the surface layer of the p-type well region 2 by the self-alignment of the other end portion of the gate electrode 7. Simultaneously with formation of the n-type source region 9, the n-type drain region 11 is formed in the surface layer of the p-type well region 2 on the side opposite to the N-type source region 9 with respect to the trench 3. The n-type source region 9 and the n-type drain region 11 may be formed separately as the case may be. Finally, the source electrode 14 and the drain electrode 15 are installed on the surface of the n-type source region 9 and on the surface of the n-type drain region 11, respectively. There is no difficult steps, providing that only the step to form the trench 3 and the step to fill-up the insulating film 5 are added to a conventional process to produce a lateral DMOSFET.

Figure 4:
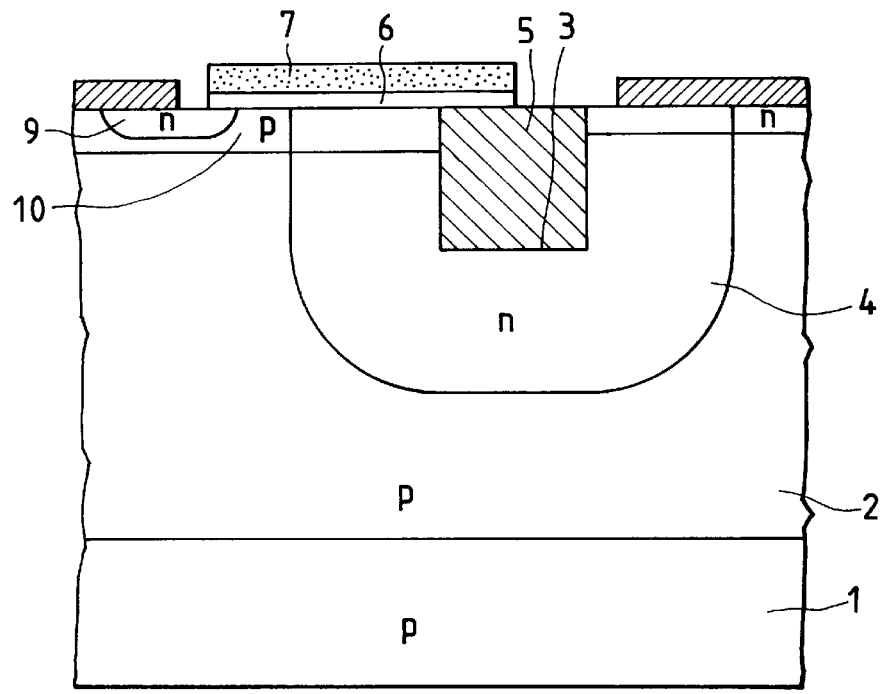
FIG. 4 is a sectional view of a main portion of a lateral MOSFET with a trench according to a second embodiment of the present invention.

FIG. 4 is a sectional view showing a main portion of a lateral MOSFET with a trench, which is a second embodiment of the present invention. A p-type well region 2 is formed in a surface layer of a p-type substrate 1. A trench 3 which is 1 μm wide and 1 μm deep is formed in the surface layer of the p-type well region 2, an n-type drain drift region 4 is formed n the side and bottom surfaces of the trench 3, and an insulating film 5 is filled up in the trench 3. It is a difference from the first embodiment in FIG. 1 that the p-type base region 8 is not provided. In the same manner as in first embodiment, a gate electrode 7 consisting of polysilicon is provided on the surface of a semiconductor layer through a gate oxide film 6 so as to project over the trench 3 from the side of an n-type source region 9 by 0.5 μm. Also in this high withstand-voltage lateral MOSFET with a trench, a high withstand voltage and a low on-resistance can be obtained in the same manner as in the first embodiment, if the values of the density and diffusion depth of impurities of the p-type well region 2 and the p-type channel region 10 are selected suitably.

Figure 5:
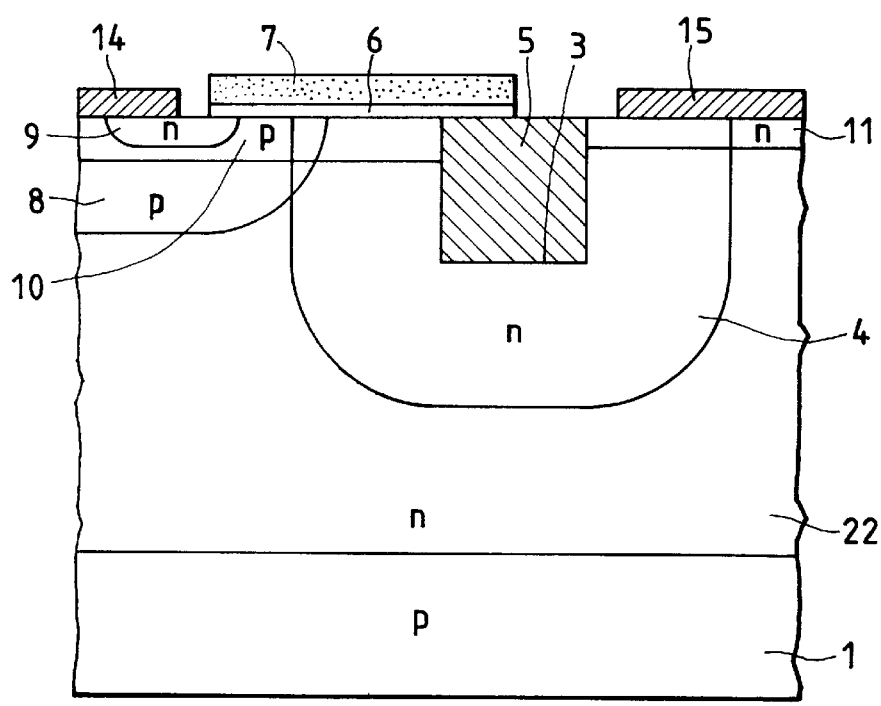
FIG. 5 is a sectional view of a main portion of a lateral MOSFET with a trench according to a third embodiment of the present invention.

FIG. 5 is a sectional view showing a main portion of a lateral MOSFET with a trench, which is a third embodiment of the present invention. An n-type well region 22 having common dimensions with an n-type well of a logic portion is formed in a surface layer of a p-type substrate 1 having a specific resistance of 12.5 Ωcm. The surface density of this n-type well region 22 is $3 \times 10^{16}$ cm$^{-3}$, and the diffusion depth (xj) is 4 μm. A p-type base region 8 and an n-type source region 9 are formed on a surface layer of the n-type well region 22 in self-alignment by double diffusion. A trench 3 which is 1 μm wide and 1 μm deep is formed in the surface layer of the n-type well region 22 at a slight distance from the p-type base region 8. An n-type drain drift region 4 is formed on the side and bottom surfaces of the trench 3, and an insulating film 5 is filled up in the trench 3. Diffusion is made uniformly in the side and bottom surfaces of the trench 3 with the surface density of $9 \times 10^{16}$ cm$^{-3}$ and diffusion depth xj of about 1.0 μm. A gate electrode 7 consisting of polysilicon is provided on the surface of the p-type base region 8 and the n-type drain drift region 4 through a gate oxide film 6 so that the gate electrode 7 projects over the trench 3 from the n-type source region 9 by 0.5 μm. A p-type channel region 10 is formed on surface layers of the p-type base region 8 and the n-type drain drift region 4 directly under the gate electrode 7. An n-type drain region 11 is formed in a surface layer of the p-type well region 22 on the side opposite to the p-type base region 8 with respect to the trench 3, and a drain electrode 15 is provided so as to contact the n-type drain region 11. A source electrode 14 is provided so as to contact the surface of the n-type source region 9. Also in this lateral MOSFET with a trench, a high withstand voltage and a low on-resistance can be obtained in the same manner as in the first embodiment, if the values of the density and diffusion depth of impurities of the p-type base region 8 and the p-type channel region 10 are selected suitably.

Figure 6:
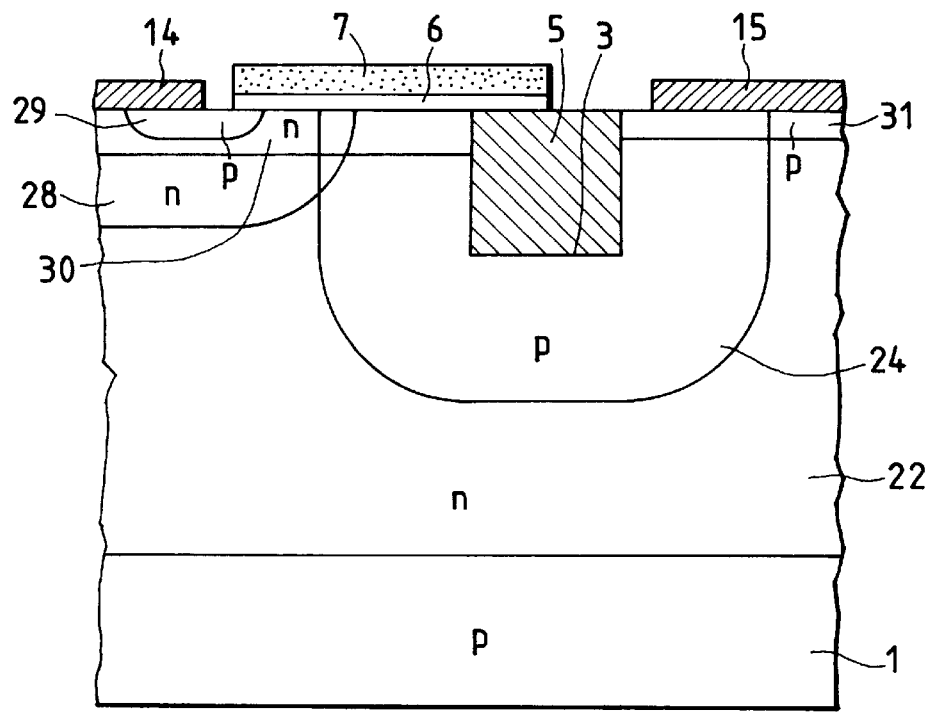
FIG. 6 is a sectional view of a main portion of a lateral MOSFET with a trench according to a fourth embodiment of the present invention.

FIG. 6 is a sectional view showing a main portion of a high withstand-voltage lateral MOSFET with a trench, which is a fourth embodiment of the present invention. An n-type well region 22 having common dimensions with an n-type well region of a logic portion is formed on a p-type substrate 1 having a specific resistance of 12.5 Ωcm. The surface density of this n-type well region 22 is $3 \times 10^{16}$ cm$^{-3}$, and diffusion depth xj is 4 μm. A trench 3 which is 1 μm wide and 1 μm deep is formed in the surface layer of the n-type well region 22. After p-type doped polysilicon has been laid on the trench 3, the doped polysilicon is diffused to the Si substrate by heat treatment. In the side and bottom surfaces of the trench 3, diffusion is made uniformly with the surface density of $1 \times 10^{17}$ cm$^{-3}$ and diffusion depth xj of about 1.0 μm by the heat treatment after the p-type doped silicon is laid thereon to thereby form a p-type drain drift region 24. Thereafter, the doped silicon in the trench 3 is removed, and an insulating film 5 is laid in the trench 3. Then, a gate oxide film 6 which is 20 nm thick is formed, and a gate electrode 7 is formed. This gate electrode 7 consists of polysilicon, and the drain-side end thereof is formed to project over the trench 3 by 0.5 μm. An n-type base region 28 and a p-type source region 29 are formed in the surface layer of the n-type well region 22 by the self-alignment of the other end portion of the gate electrode 7. An n-channel region 30 for adjusting the threshold voltage is also formed in the surface layer of the n-type well region 2. A p-type drain region 31 is formed in a surface layer of the n-type well region 22 on the side opposite to the n-type base region 28 with respect to the trench 3, and a drain electrode 15 is provided so as to contact the p-type drain region 31. A source electrode 14 contacts the surface of the p-type source region 29. This embodiment has a symmetrical conductive type with that of the first embodiment of FIG. 1 except for the p-type substrate 1. For the same reason as in the first embodiment, the trade-off characteristic of the withstand voltage and the on-resistance can be improved conspicuously also in this embodiment.

Figure 7:
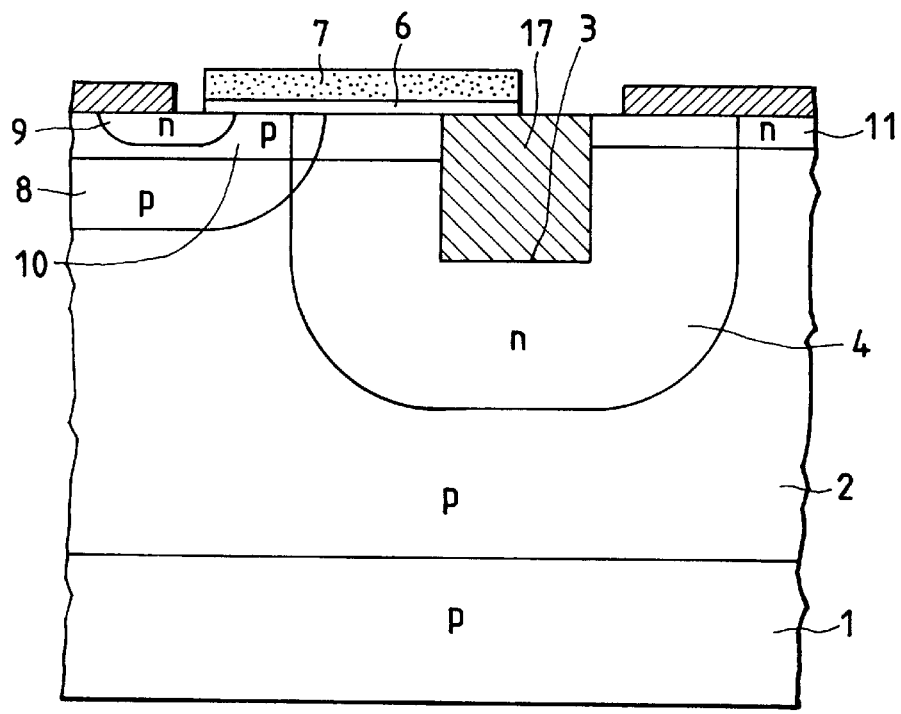
FIG. 7 is a sectional view of a main portion of a lateral MOSFET with a trench according to fifth embodiment of the present invention.

FIG. 7 is a sectional view showing a main portion of a high withstand-voltage lateral MOSFET with a trench, which is a fifth embodiment of the present invention. A p-type well region 2 is formed in a surface layer of a p-type substrate 1. A trench 3 which is 1 μm wide and 1 μm deep is formed in the surface layer of the p-type well region 2, and an n-type drain drift region 4 is formed on the side and bottom surfaces of the trench 3. This embodiment is different from the first embodiment of FIG. 1 in that a semi-insulating film 17 consisting of high-resistance polysilicon is filled up in the trench 3. In the same manner as in first embodiment, a gate electrode 7 consisting of polysilicon is provided on the surface of a p-type base region 8 and the n-type drain drift region 4 through a gate oxide film 6 so as to project by 0.5 μm over the trench 3 from an n-type source region 9. Reference numeral 10 represents a p-type channel region, and 11 represents an n-type drain region. Because an electric field is distributed over the semi-insulating film 17 in the trench 3 in this lateral MOSFET with a trench, the withstand voltage can be made high.

Figure 8:
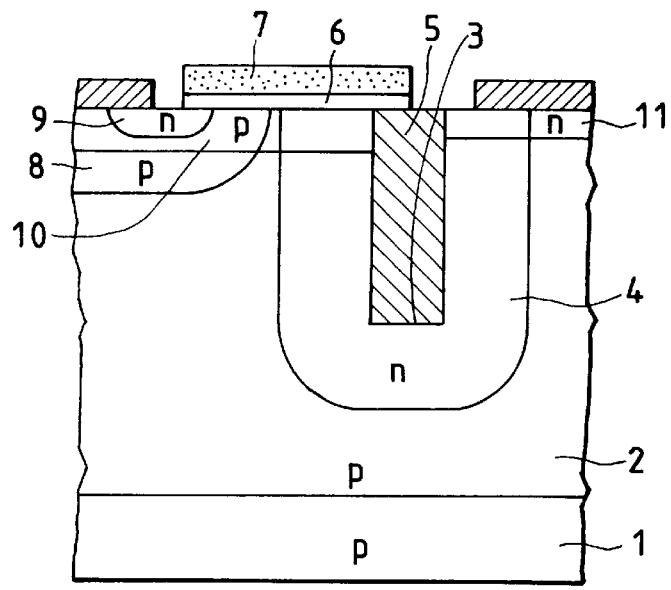
FIG. 8 is a sectional view of a main portion of a lateral MOSFET with a trench according to a sixth embodiment of the present invention.

FIG. 8 is a sectional view showing a main portion of a high withstand-voltage lateral MOSFET with a trench, which is a sixth embodiment of the present invention. A p-type well region 2 is formed in a surface layer of a p-type substrate 1. A trench 3 which is 1 μm wide and 3 μm deep is formed in the surface layer of the p-type well region 2, and an n-type drain drift region 4 is formed on the side and bottom surfaces of the trench 3. An insulating film 5 is filled up in the trench 3. In this case, of course, the diffusion depth of the p-type well region 2 is set to be 4 μm or more. This embodiment is different from the first embodiment of FIG. 1 in that the depth of the trench 3 is larger than the width thereof. In the same manner as in first embodiment, a gate electrode 7 consisting of polysilicon is provided on the surface of a p-type base region 8 and the n-type drain drift region 4 through a gate oxide film 6 so as to project by 0.5μ mover the trench 3 from an n-type source region 9. The reference numeral 10 represents a p-type channel region, and 11 represents an n-type drain region. In this high withstand-voltage lateral MOSFET with a trench, the drain drift length is increased and the withstand voltage is improved. Because the device cell pitch is not increased then, the on-resistance can be reduced on a large scale in comparison with a lateral DMOSFET having the same withstand voltage. Although the p-type base region 8 is provided away from the n-type drain drift region 4 in this embodiment unlike in the embodiment of FIG. 1, such a structure may be adopted.

Figure 9:
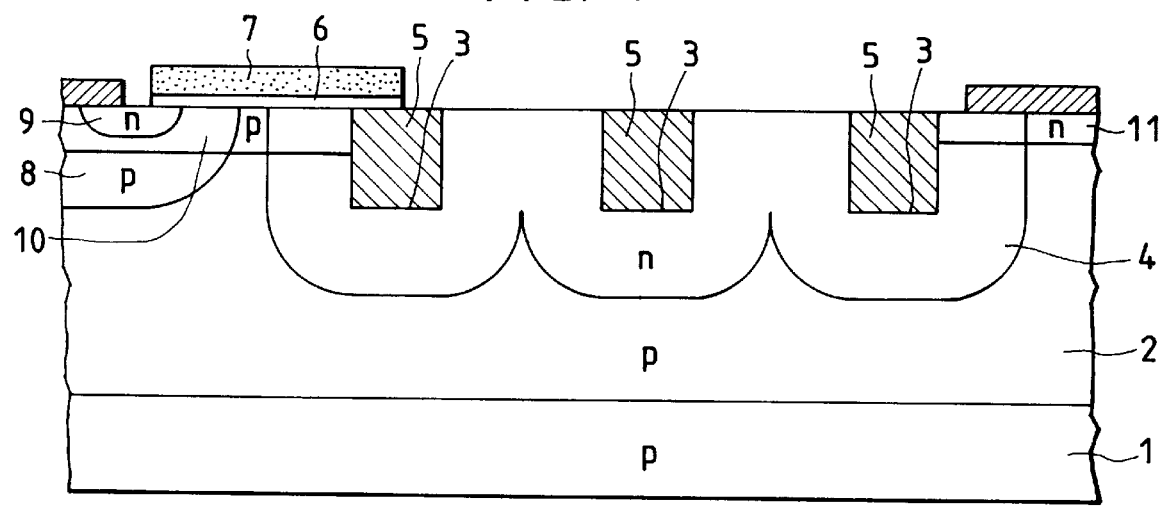
FIG. 9 is a sectional view of a main portion of a lateral MOSFET with a trench according to a seventh embodiment of the present invention.

FIG. 9 is a sectional view showing a main portion of a high withstand-voltage lateral MOSFET with a trench, which is a seventh embodiment of the present invention. A p-type well region 2 is formed in a surface layer of a p-type substrate 1. Three trenches 3 each of which is 1 μm wide and 1 μm deep are formed in the surface layer of the p-type well region 2, and n-type drain drift regions 4 are connected in series on the respective side and bottom surfaces of the trenches 3. Insulating films 5 are filled up in the respective trenches 3. This embodiment is different from the first embodiment of FIG. 1 in that the number of the trenches 3 is increased. In the same manner as in the first embodiment, a gate electrode 7 consisting of polysilicon is provided on the surface of a p-type base region 8 and the n-type drain drift region 4 through a gate oxide film 6 so as to project by 0.5 μm over the trench 3 from an n-type source region 9. The reference numeral 10 represents a p-type channel region, and 11 represents an n-type drain region. In this high withstand-voltage lateral MOSFET with a trench, the drain drift length is made three times as large as that in FIG. 1, so that the withstand voltage is improved. In addition, because the device cell pitch can be reduced sufficiently in comparison with a lateral DMOSFET having the same withstand voltage, the on-resistance can be reduced.

Figure 10A:
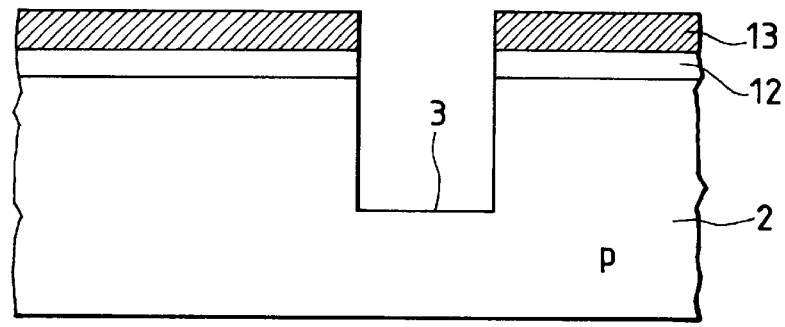
FIGS. 10A to 10C are sectional views of a main portion in the order of processes for explaining a first method of forming a drain drift region of a lateral MOSFET with a trench according to the present invention.
Figure 10B:
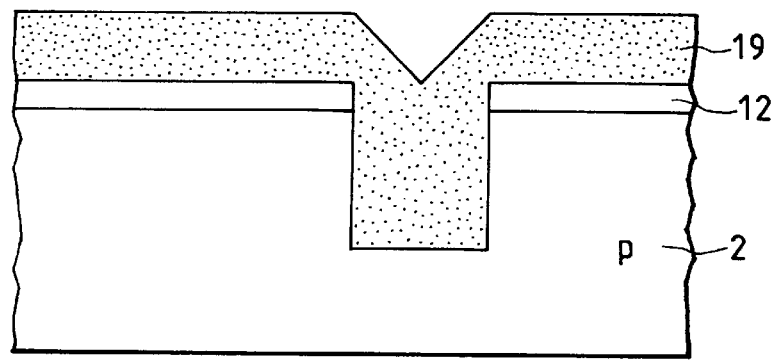
Figure 10C:
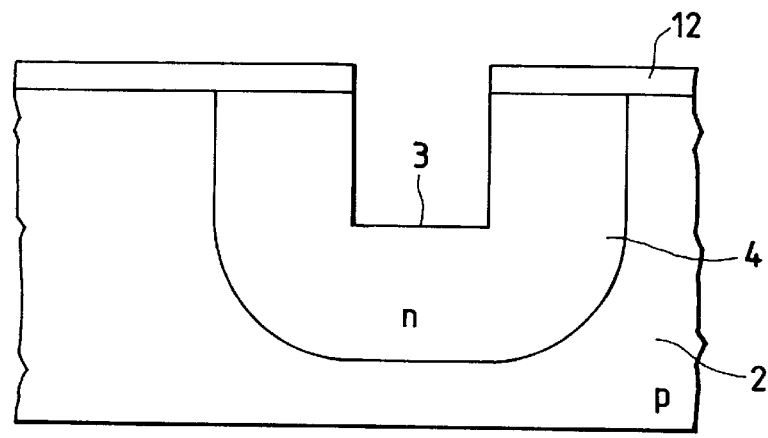

FIGS. 10A to 10C are sectional views illustrating a main portion in the order of steps for explaining a first method of forming a drain drift region of a lateral MOSFET with a trench according to the present invention. Although description has been made simply in the first embodiment, a photo resist 13 is put on an oxide film 12, and a window is opened in the surface of a p-type well region 2 correspondingly to a portion where a trench 3 should be formed and then the trench 3 is formed thereon (FIG. 10A). The photo resist 13 is removed, a doped polysilicon film 19 made to include phosphorus by the decompression CVD method is laid thereon (FIG. 10B). Subsequently, the phosphorus is diffused into the inner wall of the trench 3 from the doped polysilicon film 19 by heat treatment to thereby form an n-type drain drift region 4, and thereafter the doped polysilicon film 19 is removed (FIG. 10C). In this method, it is possible to reduce the density of impurities in the n-type drain drift region 4 along the inner wall of the trench 3 so as to make the withstand voltage higher.

Figure 11A:
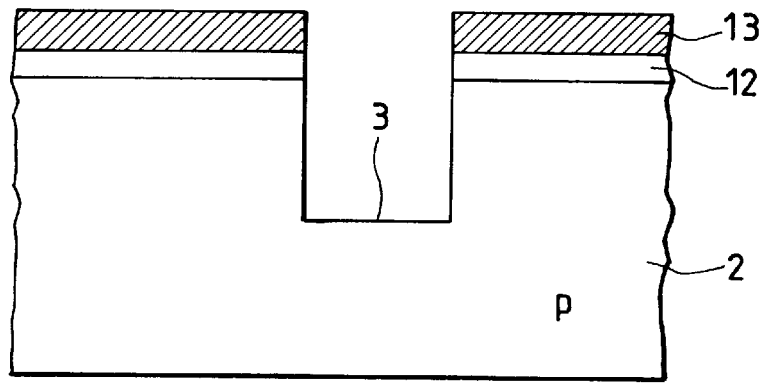
FIGS. 11A to 11C are sectional views of a main portion in the order of processes for explaining a second method of forming a drain drift region of a lateral MOSFET with a trench according to the present invention.
Figure 11B:
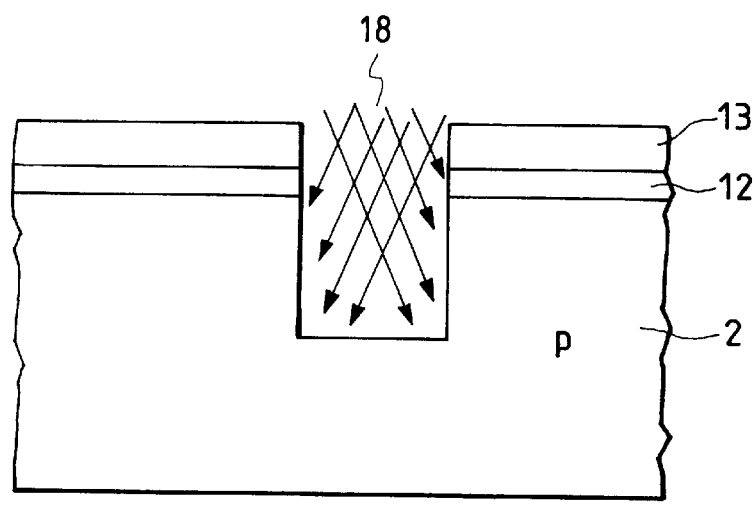
Figure 11C:
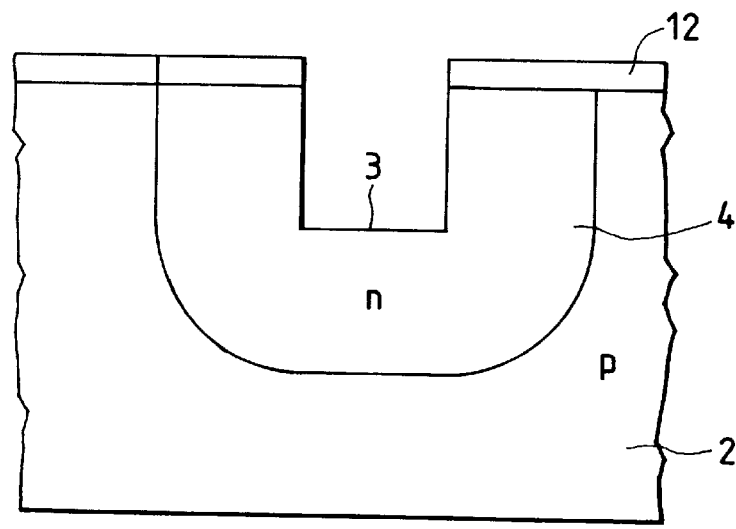

FIGS. 11A to 11C are sectional views illustrating a main portion in the order of steps for explaining a second method of forming a drain drift region of a lateral MOSFET with a trench according to the present invention. In the same manner as in the method of FIG. 10, a photo resist 13 is put on an oxide film 12, a window is opened in the surface of a p-type well region 2 correspondingly to a portion where a trench 3 should be formed, and then the trench 3 is formed therein (FIG. 11A). The photo resist 13 for forming the trench 3 is left as it is, and phosphorous ions 18 are injected obliquely (FIG. 11B). After the photo resist 13 has been removed, the phosphorus is diffused by heat treatment so as to form an n-type drain drift region 4 (FIG. 11C). In this method, because a photo mask for forming the trench 3 is used also for forming the n-type drain drift region 4, there is no case where the mask is displaced. In addition, the density of impurities in the n-type drain drift region 4 can be made low in the side surfaces of the trench 3 and high in the bottom surface of the same, so that the concentration of an electric field on the upper portions of the side surfaces of the trench can be relieved, and the on-resistance can be reduced.

Figure 12A:
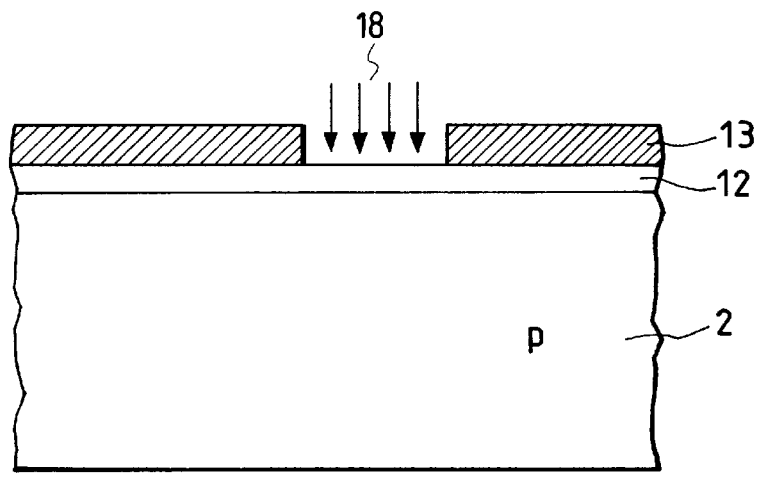
FIGS. 12A to 12C are sectional views of a main portion in the order of processes for explaining a third method of forming a drain drift region of a lateral MOSFET with a trench according to the present invention.
Figure 12B:
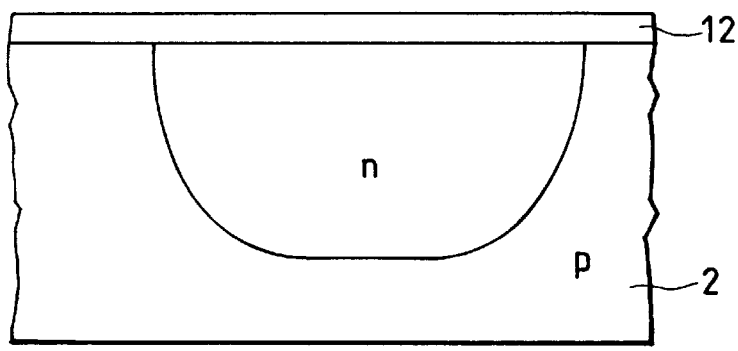
Figure 12C:
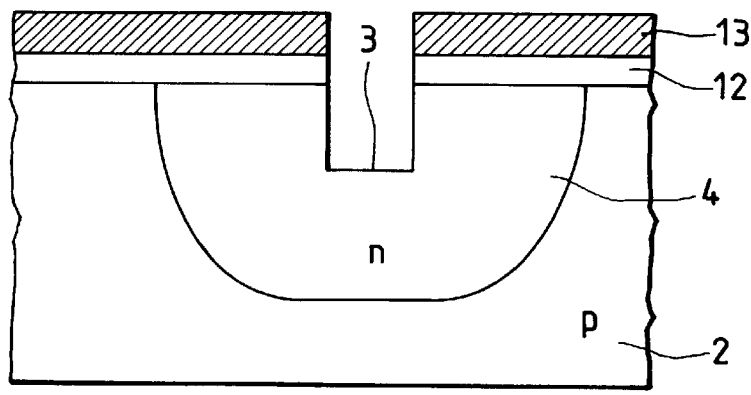
Figure 13:
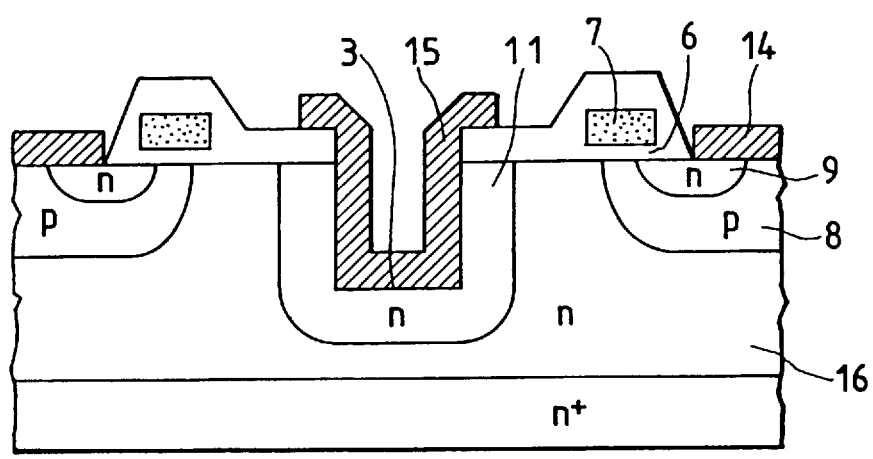
FIG. 13 is a sectional view of a main portion of a conventional lateral MOSFET with a trench.

FIGS. 12A to 12C are sectional views illustrating a main portion in the order of steps for explaining a third method of forming a drain drift region of a lateral MOSFET with a trench according to the present invention. First, after a thin oxide film 12 has been formed on the surface of a p-type well region 2, a pattern of a photo resist 13 is formed thereon, and phosphorous ions 18 for forming an n-type drain drift region are injected (FIG. 12A). After the photo resist 13 has been removed, the phosphorus is diffused by heat treatment so as to form an n-type drain drift region 4 (FIG. 12B). The photo resist 13 is applied again, a pattern for forming a trench is formed and then a trench 3 is formed therein (FIG. 12C). In this method, the density of impurities in the n-type drain drift region 4 along the bottom portion of the trench 3 can be made low to thereby make the withstand voltage high.

As has been described above, in the high withstand-voltage lateral MOSFET with a trench according to the present invention, since a trench is formed and a drain drift region is formed on the side and bottom surfaces of the trench, it is possible to improve the trade-off characteristic of the withstand voltage and the on-resistance conspicuously. In addition, since the portion required for the drain drift region is reduced, it is possible to reduce the chip size so that the theoretical number of obtained chips per wafer can be increased in the case of using the high withstand-voltage lateral MOSFET with a trench according to the present invention as a separate unit device, while in the case of using it in an IC, the MOSFET can be integrated highly. Since the number of increased steps to form a trench is not large, the cost can be reduced as a whole. In addition, it is possible to reduce the power consumption of a semiconductor device, so that it is made easy to apply the semiconductor device to a potable electronic apparatus, or the like.

The foregoing description of a preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A high withstand-voltage lateral MOSFET with a trench, comprising:

a second conductive type semiconductor layer;

a first conductive type base region formed in a portion of a surface layer of said second conductive type semiconductor layer;

a second conductive type source region formed in self-alignment in a portion of a surface layer of said first conductive type base region;

a second conductive type drain drift region formed in a portion of the surface layer of said second conductive type semiconductor layer;

a trench formed in a surface layer of said second conductive type drain drift region from a surface side thereof;

a second conductive type drain region formed in the surface layer of said second conductive type semiconductor layer on a side opposite to said first conductive type base region with respect to said trench and partially overlapping said second conductive type drain drift region;

a gate electrode which is provided on an exposed surface portion of said first conductive type base region through a gate oxide film;

a source electrode provided on a surface of said second conductive type source region; and a drain electrode provided on a surface of said second conductive type drain region.

2. A high withstand-voltage lateral MOSFET with a trench according to claim 1, further comprising a first conductive type channel region formed in a surface layer directly under said gate electrode between said second conductive type source region and said trench.

3. A high withstand-voltage lateral MOSFET with a trench according to claim 1, further comprising an insulating film filling said trench.

4. A high withstand-voltage lateral MOSFET with a trench according to claim 1, further comprising a semi-insulating film filling said trench.

5. A high withstand-voltage lateral MOSFET with a trench according to claim 3 or 4 wherein said gate electrode extends over said trench.

6. A high withstand-voltage lateral MOSFET with a trench according to claim 1, wherein a depth of said trench is larger than a width thereof.

7. A high withstand-voltage lateral MOSFET with a trench according to claim 1, wherein a plurality of trenches are formed, and a plurality of second conductive type drain drift regions formed along inner walls of said trenches are connected in series.

8. A high withstand-voltage lateral MOSFET with a trench according to claim 4, wherein said gate electrode extends over said trench.

9. A high withstand-voltage lateral MOSFET with a trench according to claim 1, wherein said gate electrode extends over said trench.

10. A high withstand-voltage lateral MOSFET with a trench according to claim 2, wherein said gate electrode extends over said trench.

11. A high withstand-voltage lateral MOSFET with a trench according to claim 6, wherein said gate electrode extends over said trench.

12. A high withstand-voltage lateral MOSFET with a trench, comprising:
    a first conductive type semiconductor layer;
    a second conductive type source region;
    a second conductive type drain drift region, said second conductive type source region and said second conductive type drain drift region being formed in a portion of a surface layer of said first conductive type semiconductor layer at a distance from each other;
    a trench, filled with an insulating film, formed in a surface layer of said second conductive type drain drift region from a surface side thereof;
    a second conductive type drain region formed in the surface layer of said first conductive type semiconductor layer on a side opposite to said second conductive type source region with respect to said trench and partially overlapping said second conductive type drain drift region;
    a gate electrode, extending over said trench, provided on an exposed surface portion of said first conductive type semiconductor layer through a gate oxide film;
    a source electrode provided on a surface of said second conductive type source region; and
    a drain electrode provided on a surface of said second conductive type drain region.

13. A high withstand-voltage lateral MOSFET with a trench, comprising:
    a first conductive type semiconductor layer;
    a second conductive type source region;
    a second conductive type drain drift region, said second conductive type source region and said second conductive type drain drift region being formed in a portion of a surface layer of said first conductive type semiconductor layer at a distance from each other;
    a trench, filled with a semi-insulating film, formed in a surface layer of said second conductive type drain drift region from a surface side thereof;
    a second conductive type drain region formed in the surface layer of said first conductive type semiconductor layer on a side opposite to said second conductive type source region with respect to said trench and partially overlapping said second conductive type drain drift region;
    a gate electrode, extending over said trench, provided on an exposed surface portion of said first conductive type semiconductor layer through a gate oxide film;
    a source electrode provided on a surface of said second conductive type source region; and
    a drain electrode provided on a surface of said second conductive type drain region.

14. A high withstand-voltage lateral MOSFET with a trench, comprising:
    a first conductive type semiconductor layer;
    a first conductive type base region formed in a portion of a surface layer of said first conductive type semiconductor layer;
    a second conductive type source region formed in self-alignment in a portion of a surface layer of said first conductive type base region;
    a second conductive type drain drift region formed in a portion of the surface layer of said first conductive type semiconductor layer;
    a trench, filled with an insulating film, formed in a surface layer of said second conductive type drain drift region from a surface side thereof;
    a second conductive type drain region formed in the surface layer of said first conductive type semiconductor layer on a side opposite to said first conductive type base region with respect to said trench and partially overlapping said second conductive type drain drift region;
    a gate oxide film;
    a gate electrode, extending over said trench, provided on an exposed surface portion of said first conductive type base region through said gate oxide film;
    a source electrode provided on a surface of said second conductive type source region; and
    a drain electrode provided on a surface of said second conductive type drain region.

15. A high withstand-voltage lateral MOSFET with a trench, comprising:
    a first conductive type semiconductor layer;
    a first conductive type base region formed in a portion of a surface layer of said first conductive type semiconductor layer;
    a second conductive type source region formed in self-alignment in a portion of a surface layer of said first conductive type base region;
    a second conductive type drain drift region formed in a portion of the surface layer of said first conductive type semiconductor layer;
    a trench, filled with a semi-insulating film, formed in a surface layer of said second conductive type drain drift region from a surface side thereof;
    a second conductive type drain region formed in the surface layer of said first conductive type semiconductor layer on a side opposite to said first conductive type base region with respect to said trench and partially overlapping said second conductive type drain drift region;
    a gate oxide film;
    a gate electrode, extending over said trench, provided on an exposed surface portion of said first conductive type base region through said gate oxide film;
    a source electrode provided on a surface of said second conductive type source region; and
    a drain electrode provided on a surface of said second conductive type drain region.

* * * * *